(12) United States Patent
Stong (10) Patent No.: US 6,769,101 B2
(45) Date of Patent: Jul. 27, 2004

(54) SYSTEMS AND METHODS PROVIDING SCAN-BASED DELAY TEST GENERATION

(75) Inventor: Gayvin E Stong, Fort Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/144,116

(22) Filed: May 13, 2002

(65) Prior Publication Data

US 2003/0212970 A1 Nov. 13, 2003

(51) Int. Cl.[7] .................................................. G06F 9/45
(52) U.S. Cl. ..................... 716/5; 716/4; 716/6; 714/30; 714/724; 324/763; 324/764; 324/765
(58) Field of Search ............................... 716/1, 4, 5, 6; 714/30, 724–745; 324/765, 212.212, 763–764

(56) References Cited

U.S. PATENT DOCUMENTS

| | | | |
|---|---|---|---|
| 5,831,992 A | * 11/1998 | Wu | 371/22.4 |
| 6,070,261 A | * 5/2000 | Tamarapalli et al. | 714/733 |
| 2002/0188432 A1 | * 12/2002 | Houlihane et al. | 703/20 |
| 2003/0025519 A1 | * 2/2003 | Hsieh | 324/765 |
| 2003/0110457 A1 | * 6/2003 | Nadeau-Dostie et al. | 716/4 |

OTHER PUBLICATIONS

Arun Balakrishnan, "Peripheral Patititioning and Tree Decomposition for Partial Scan," IEEE, 1997, pp. 181–186.*

Bayraktaroglu et al., "Diagnostis for Scan–Based BIST: Reaching Deep into the Signatures," IEEE, 2001, pp. 102–109.*

* cited by examiner

*Primary Examiner*—Vuthe Siek (57) ABSTRACT

Chip analyzer systems and methods are provided to partition chip designs into smaller blocks in order to test speed paths more efficiently for integrated circuits. In accordance with one aspect of the invention, a system includes a chip analyzer and an automatic test generator. The chip analyzer partitions information corresponding to the integrated circuit into a plurality of circuit configuration blocks, and creates a model of a selected circuit configuration block in the integrated circuit. The automatic test generator receives the model from the chip analyzer, and creates tests from the model to determine the correctness of the integrated circuit. In accordance with another aspect of the invention, the method partitions the integrated circuit into a plurality of circuit configurations, and selects a circuit configuration on the integrated circuit to be tested. Then, the method identifies logic driving input logic in the selected circuit configuration of the integrated circuit; and identifies logic driving output logic in the selected circuit configuration of the integrated circuit.

11 Claims, 6 Drawing Sheets

SYSTEMS AND METHODS PROVIDING SCAN-BASED DELAY TEST GENERATION

BACKGROUND OF THE INVENTION

1. Field of the Invention

The present invention is generally related to computer-aided circuit analysis and, more particularly, to systems and methods for partitioning chip designs into smaller blocks in order to test speed paths.

2. Discussion of the Related Art

Integrated circuits (ICs) are electrical circuits comprised of transistors, resistors, capacitors, and other components on a single semiconductor "chip" in which the components are interconnected to perform a variety of functions. Typical examples of ICs include, microprocessors, programmable logic devices (PLDs), electrically erasable programmable read only memory devices (EEPROMs), random access memory devices (RAMs), operational amplifiers and voltage regulators. A circuit designer typically designs the IC by creating a circuit schematic indicating the electrical components and their interconnections. Often, designs are simulated by computer to verify functionality and to ensure that performance goals are satisfied.

In electrical device engineering, the design and analysis work involved in producing electronic devices is often performed using electronic computer-aided design (E-CAD) tools. Electronic devices include analog, digital, mixed hardware, optical, electromechanical, and a variety of other electrical devices. In particular, circuit, very large scale integration chip, or other electrical device via E-CAD tools allows a curcuit to be thoroughly tested and often eliminates the need for building a prototype. Thus, today's sophisticated E-CAD tools may enable the circuit manufacturer to go directly to the manufacturing stage without having to perform costly, time consuming prototyping.

In order to perform the simulation and analysis of a hardware device, E-CAD tools utilize an electronic representation of the hardware device. A "netlist" is one common representation of a hardware device that includes the circuit. A "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often, a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the schematic of the circuit device.

In contrast, a hierarchical netlist will only maintain one copy of a circuit module, which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component where the inputs, outputs, and general function are known, but the contents of which are not shown. These "black box" representations, hereinafter called "modules," will mask the complexities therein, typically showing only input/output ports.

An IC design can be represented at different levels of abstraction, such as at the register-transfer level (RTL) and the at logic level, using a hardware description language (HDL). VHDL® and Verilog® are examples of HDL languages. At any abstraction level, an IC design is specified using behavioral or structural descriptions, or a mix of both. At the logic level, the behavioral description is specified using Boolean equations. The structural description is represented as a netlist of primitive cells. Examples of primitive cells are, among others, full-adders, logic gates, latches, and flip flops.

Set forth above is some very basic information regarding integrated circuits and other circuit schematics that are represented in netlists. Systems are presently known that use the information provided in netlists to evaluate circuit timing and other related parameters. More specifically, systems are known that perform a timing analysis of circuits using netlist files. Although the operational specifics may vary from system to system, generally, such systems operate by identifying certain critical timing paths, then evaluating the circuit to determine whether timing violations may occur through the critical paths. As is known, timing specifications may be provided to such systems by way of a configuration file.

While there is extensive testing of designs of electronic devices in the design phase, there is also a need for testing of electronic devices after manufacture to eliminate any devices with manufacturing flaws. Much of the same input information utilized in the testing of the virtual circuits may be utilized in the creation of tests for the actual hardware component. These data inputs can be utilized in test generation systems.

Test generation refers to the generation of vectors to test whether the actual device is defect free and meets the timing specifications it was designed to meet. Typically, test generation systems that generate test programs to test an actual device require significant amounts of run time and are memory intensive. This is because the test programs ordinarily generate tests for the entire chip at once.

Thus, a heretofore unaddressed need exists in the industry to address the aforementioned and/or other deficiencies and inadequacies as chip complexity and density increases.

SUMMARY OF THE INVENTION

The present invention provides chip analyzer systems and methods for partitioning chip designs into smaller blocks in order to test speed paths for an integrated circuit. Briefly described, in architecture, one embodiment of the system includes a chip analyzer and an automatic test generator. The chip analyzer partitions information corresponding to the integrated circuit into a plurality of circuit configuration blocks, and creates a model of a selected circuit configuration block in the integrated circuit. The automatic test generator receives the model from the chip analyzer, and creates tests from the model to determine the correctness of the integrated circuit.

The invention can also be viewed as providing one or more methods for partitioning of a chip design into smaller blocks in order to test speed paths more efficiently for an integrated circuit. In this regard, one such method can be summarized by the following steps: (1) partitioning the integrated circuit into a plurality of circuit configurations; (2) selecting a circuit configuration on the integrated circuit to be tested; (3) identifying logic driving input logic in the selected circuit configuration of the integrated circuit; and (4) identifying logic driving output logic in the selected circuit configuration of the integrated circuit.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION

Having summarized various aspects of the present invention, the invention will now be described in detail with reference to the drawings. While the invention will be described in connection with these drawings, there is no intent to limit it to the embodiment or embodiments disclosed therein. On the contrary, the intent is to cover all alternatives, modifications and equivalents included within the spirit and scope of the invention as protected by the appended claims.

As will be described in detail here, systems and methods of the invention partition large, complex chip designs into smaller pieces (i.e. blocks), in order to handle the complexity and density of the hierarchy in large chips during electronic test generation. In particular, embodiments of chip analyzers of the present invention partition large, complex chip designs into smaller blocks so that test generator logic can generate tests for these smaller blocks. The tests for these smaller blocks require reduced memory size and run time than that typically required for tests generated for an unpartitioned chip. This enables a large, complex chip hierarchy to be tested for logic defects, such as speed related defects, where tests are needed.

Chip analyzers of the present invention create models for test generation programs so that tests for a block under test can be generated. Such a model includes the circuitry in the block under test, plus the circuitry from other blocks that communicate with the block under test that are needed for delay testing. The inputs identified by chip analyzers of the present invention for the block under test include any logic found that drives the inputs of the logic within the block under test, and the registers (i.e. second level registers) that drive that logic.

In addition, chip analyzers of the present invention can identify values for any logic that input into these second level registers. These second level registers include any registers immediately preceding the logic in the block under test. Any logic that is input into these second level registers immediately proceeding the block under test is included as well. The logic that precedes the registers that immediately precede the logic within the block under test may have inputs from other registers (i.e. first level registers). These first level registers input into the logic that precedes the second level registers.

Output data can also be included in the model created by one embodiment of the chip analyzer of the present invention. This output data includes the logic driven by the outputs from the block under test, and any registers that follow the logic in the block under test (i.e. result registers). Other inputs to that logic in the block under test should also be included back two levels of registers as well (i.e. much the same as the input of the block). Such a model allows for the testing of all delay paths internal to the block under test, as well as the delay paths involving the inputs and outputs of the block under test. Thus, a complete test for the partition logic or block under test can be accomplished.

Delay tests include identifying the starting state for the delay path. Initial values are identified in one embodiment of the chip analyzer of the present invention, in order to sensitize the path by placing the delay path in a desired initial state. One embodiment of the chip analyzer of the present invention can accomplish identifying the desired initial state, by scanning the initial values into a register (i.e. second level register) that immediately proceeds the logic in the block under test. These initial values are values that will be transitioned under output of the second level registers into the logic under test when a clock triggers. The transition values can then be used to sensitize the path being tested and provide the transition state for the path being tested.

In order to set these transition values, one embodiment of the chip analyzer of the present invention traces back through the logic before the second level registers, including other logic and any first level registers. This is done so that logic values in first level registers, which are one level up-stream from the second level registers, can be obtained. The first level registers can then provide initial input into a first level logic that is a predecessor of the second level registers. This acquisition of input into the first level logic is done so the model created by the chip analyzer of the present invention adequately defines the inputs into the second level registers. These inputs into the second level registers are the transition values to enable testing of the logic under test which is immediately downstream of the second level registers. Then, one embodiment of the chip analyzer 40 of the present invention is enabled to determine the logic values in the first level registers when processed through the first level logic to produce the transition values. The results of the transition values are captured in the result registers on the second of two consecutive clock cycles by one embodiment of the chip analyzer of the present invention.

Figure 1:
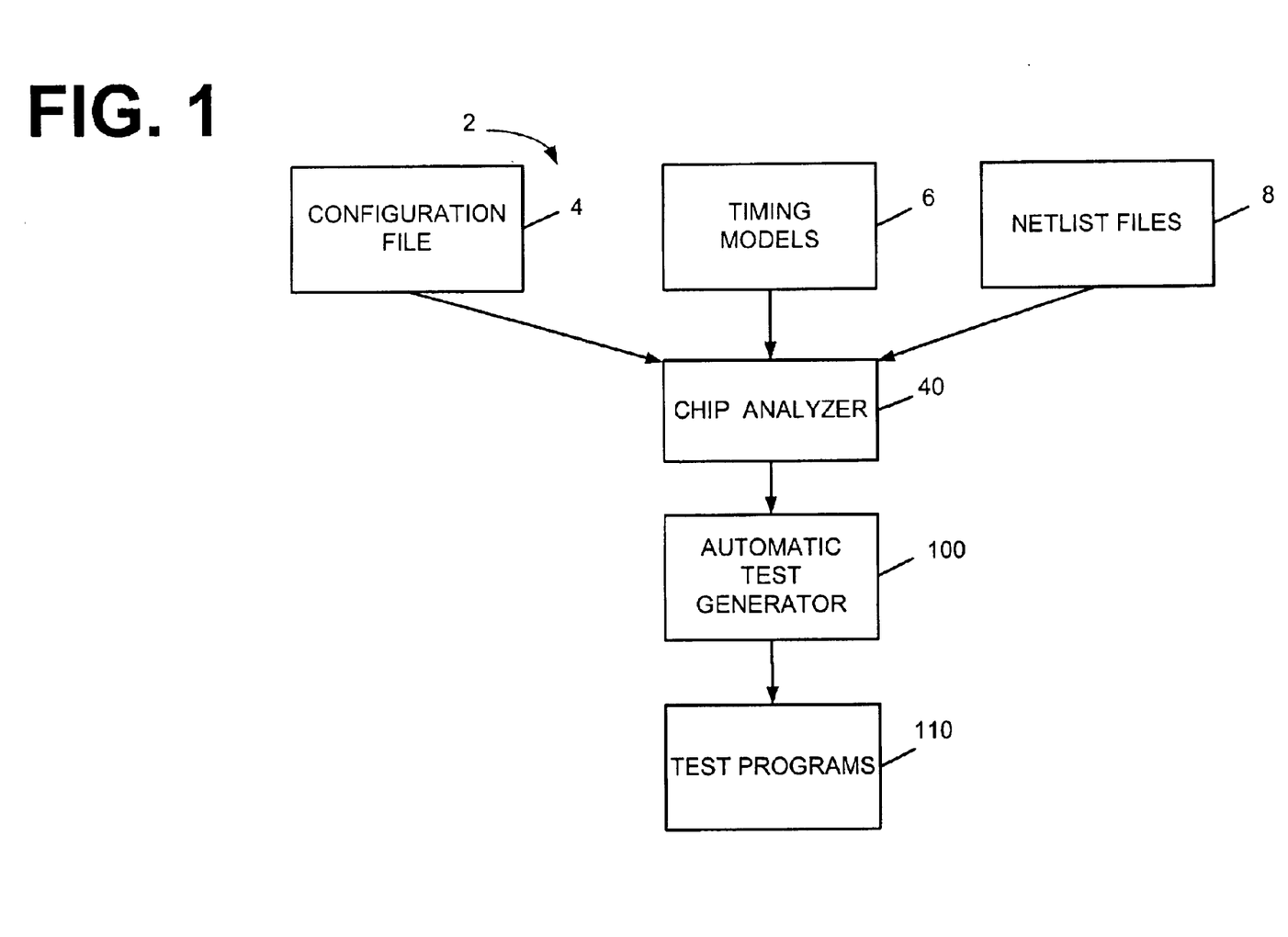
FIG. 1 is a block diagram illustrating possible implementation of the components of the chip analyzer system of the present invention.

Referring now to the drawings, FIG. 1 illustrates one embodiment of a system 2 that uses a chip analyzer 40 of the present invention. In the illustrated embodiment, the chip analyzer 40, a configuration file 4, timing models file 6, a netlist file 8, automatic test generator 100, and test programs 110 from FIG. 1 are shown. The configuration file 4 contains information that informs the chip analyzer 40 how to perform its analysis. The timing models file 6 contains information that informs the chip analyzer of the various timing sequences of particular chip under test components. The netlist file 8, as is well known, defines the various integrated circuit components, and their inter-relations. It is understood that other types of design automation software files could be used to describe a particular chip.

One embodiment of the chip analyzer 40 of the present invention generates a model of the chip under test in order to partition the chip into smaller pieces. The chip analyzer 40 is herein defined in further detail with regard to FIGS. 3–5. The chip under test is partitioned into smaller blocks to reduce the memory size and run time needed to generate test programs. After the chip has been analyzed and partitioned into smaller blocks, then the information needed to test each partition is input into an automatic test generator 100. The automatic test generator 100 evaluates the information in order to generate test programs 110. After generating the tests programs 110, each is run on each part of the chip to determine if the chip was manufactured correctly. The output of these test programs 110 is typically an error report that indicates whether or not there are any problems with a particular chip under test.

Figure 2:
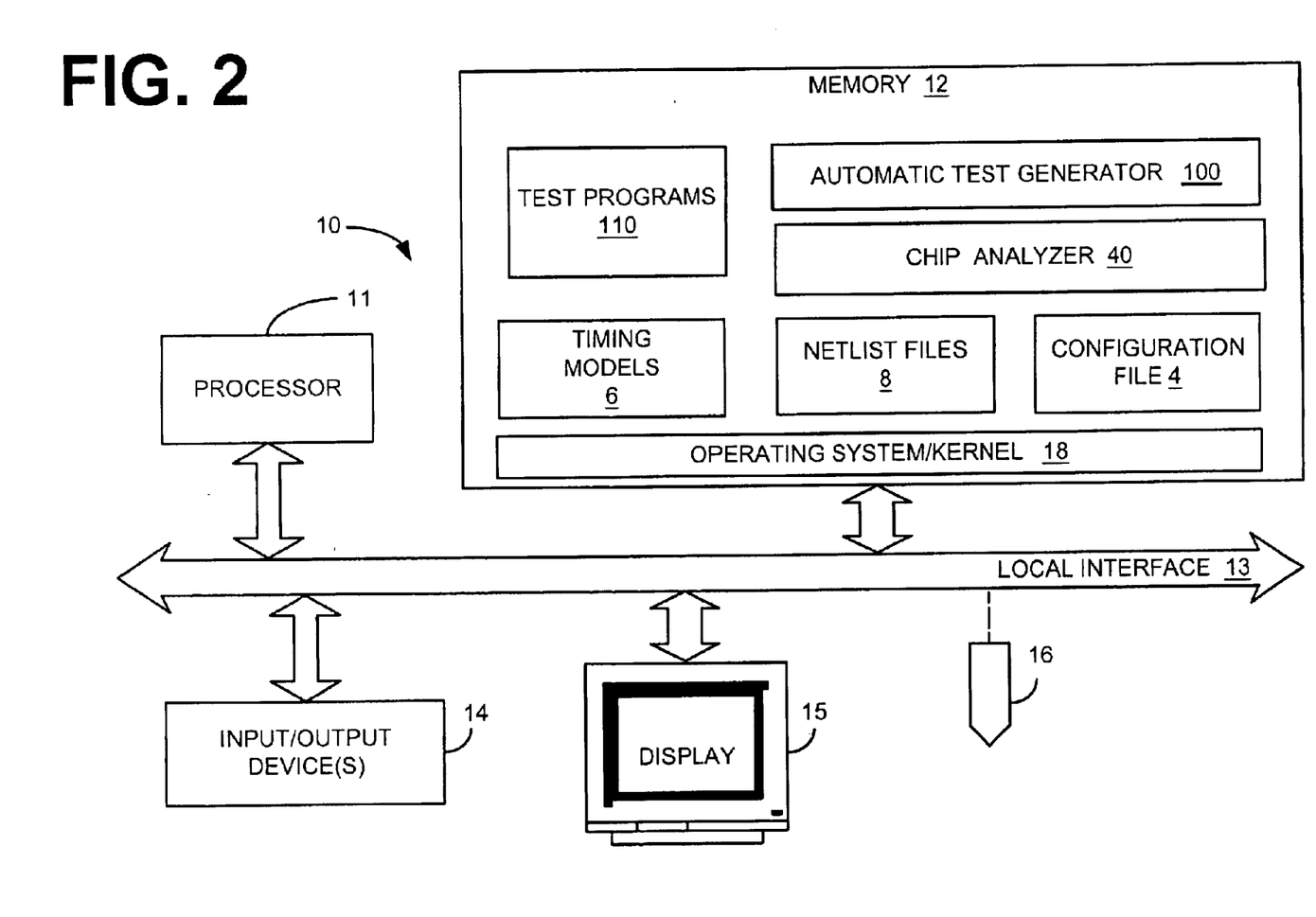
FIG. 2 is a block diagram illustrating one possible implementation of the chip analyzer of FIG. 1.

Illustrated in FIG. 2 is a block diagram showing an example of a general-purpose computer that can implement the chip analyzer 40 of the present invention. The chip analyzer 40 is shown within a computer readable medium, such as, for example, a memory in a general-purpose computer system 10. Generally, in terms of hardware architecture, as shown in FIG. 2, the computer system 10 includes a processor 11, memory 12, and one or more input devices and/or output (I/O) devices (or peripherals) that are communicatively coupled via a local interface 13. The local interface 13 can be, for example but not limited to, one or more buses or other wired or wireless connections, as is known in the art. The local interface 13 may have additional elements, which are omitted for simplicity, such as controllers, buffers (caches), drivers, repeaters, and receivers, to enable communications. Further, the local interface 13 may include address, control, and/or data connections to enable appropriate communications among the aforementioned components.

The processor 11 is a hardware device for executing software that can be stored in memory 12. The processor 11 can be virtually any custom made or commercially available processor, a central processing unit (CPU) or an auxiliary processor among several processors associated with the computer system 10, and a semiconductor based microprocessor (in the form of a microchip) or a macroprocessor. Examples of suitable commercially available microprocessors are as follows: an 80×86, Pentium, or Itanium series microprocessor from Intel Corporation, U.S.A., a PowerPC microprocessor from IBM, U.S.A., a Sparc microprocessor from Sun Microsystems, Inc, a PA-RISC series microprocessor from Hewlett-Packard Company, U.S.A., or a 68xxx series microprocessor from Motorola Corporation, U.S.A.

The memory 12 can include any one or combination of volatile memory elements (e.g., random access memory (RAM, such as DRAM, SRAM, etc.)) and nonvolatile memory elements (e.g., ROM, hard drive, tape, CDROM, etc.). Moreover, the memory 12 may incorporate electronic, magnetic, optical, and/or other types of storage media. Note that the memory 12 can have a distributed architecture, where various components are situated remote from one another, but can be accessed by the processor 11.

The software in memory 12 may include one or more separate programs, each of which comprises an ordered listing of executable instructions for implementing logical functions. In the example of FIG. 2, the software in the memory 12 includes an operating system 18, configuration file 4, timing models 6, and the netlist file 8, the chip analyzer 40, an automatic test generator 100, and test programs 110. The test programs 110 are generated by the automatic test generator 100 from data obtained from one embodiment of the chip analyzer 40 of the present invention.

A non-exhaustive list of examples of suitable commercially available operating systems 18 are as follows: a Windows operating system from Microsoft Corporation, U.S.A., a Netware operating system available from Novell, Inc., U.S.A., an operating system available from IBM, Inc., U.S.A., any LINUX operating system available from many vendors or a UNIX operating system, which is available for purchase from many vendors, such as Hewlett-Packard Company, U.S.A., Sun Microsystems, Inc. and AT&T Corporation, U.S.A. The operating system 18 essentially controls the execution of other computer programs, such as the chip analyzer 40, and provides scheduling, input-output control, file and data management, memory management, and communication control and related services.

The chip analyzer 40 and the automatic test generator 100 may be source programs, executable programs (object code), script, or any other entity comprising a set of instructions to be performed. When a source program, then the program is usually translated via a compiler, assembler, interpreter, or the like, which may or may not be included within the memory 12, so as to operate properly in connection with the O/S 18. Furthermore, the chip analyzer 40 and the automatic test generator 100 can be written in object oriented programming language, which has classes of data and methods, or (b) a procedure programming language, which has routines, subroutines, and/or functions, for example but not limited to, C, C++, Pascal, BASIC, FORTRAN, COBOL, Perl, Java, and Ada.

The I/O devices 14 may include input devices, for example but not limited to, a keyboard, mouse, scanner, microphone, etc. Furthermore, the I/O devices 14 may also include output devices, for example but not limited to, a printer, display 15, etc. Finally, the I/O devices 14 may further include devices that communicate both inputs and outputs, for instance but not limited to, a modulator/demodulator (modem; for accessing another device, system, or network), a radio frequency (RF) or other transceiver, a telephonic interface, a bridge, a router, etc. The computer system 10 includes chip interface 16 for use in accessing data on a chip. This chip interface 16 enables computer system 10 to access chips to be tested.

If the computer system 10 is a PC, workstation, or the like, the software in the memory 12 may further include a basic input output system (BIOS) (omitted for simplicity). The BIOS is a set of essential software routines that initialize and test hardware at startup, start the O/S 18, and support the transfer of data among the hardware devices. The BIOS is stored in ROM so that the BIOS can be executed when the computer system 10 is activated.

When the computer system 10 is in operation, the processor 11 is configured to execute software stored within the memory 12, to communicate data to and from the memory 12 and to generally control operations of the computer 5 pursuant to the software. The chip analyzer 40, automatic test generator 100, test programs 110 and the O/S 18 are read, in whole or in part, by the processor 11, perhaps buffered within the processor 11, and then executed.

When the chip analyzer 40, automatic test generator 100 and the test programs 110 are implemented in software, as is shown in FIG. 1, it should be noted that they can be stored on virtually any computer readable medium for use by or in connection with any computer related system or method. In the context of this document, a computer readable medium is an electronic, magnetic, optical, or other physical device or means that can contain or store a computer program for use by or in connection with a computer related system or method. The chip analyzer 40, automatic test generator 100 and the test programs 110 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, where chip analyzer 40 is implemented in hardware, the chip analyzer 40 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Figure 3:
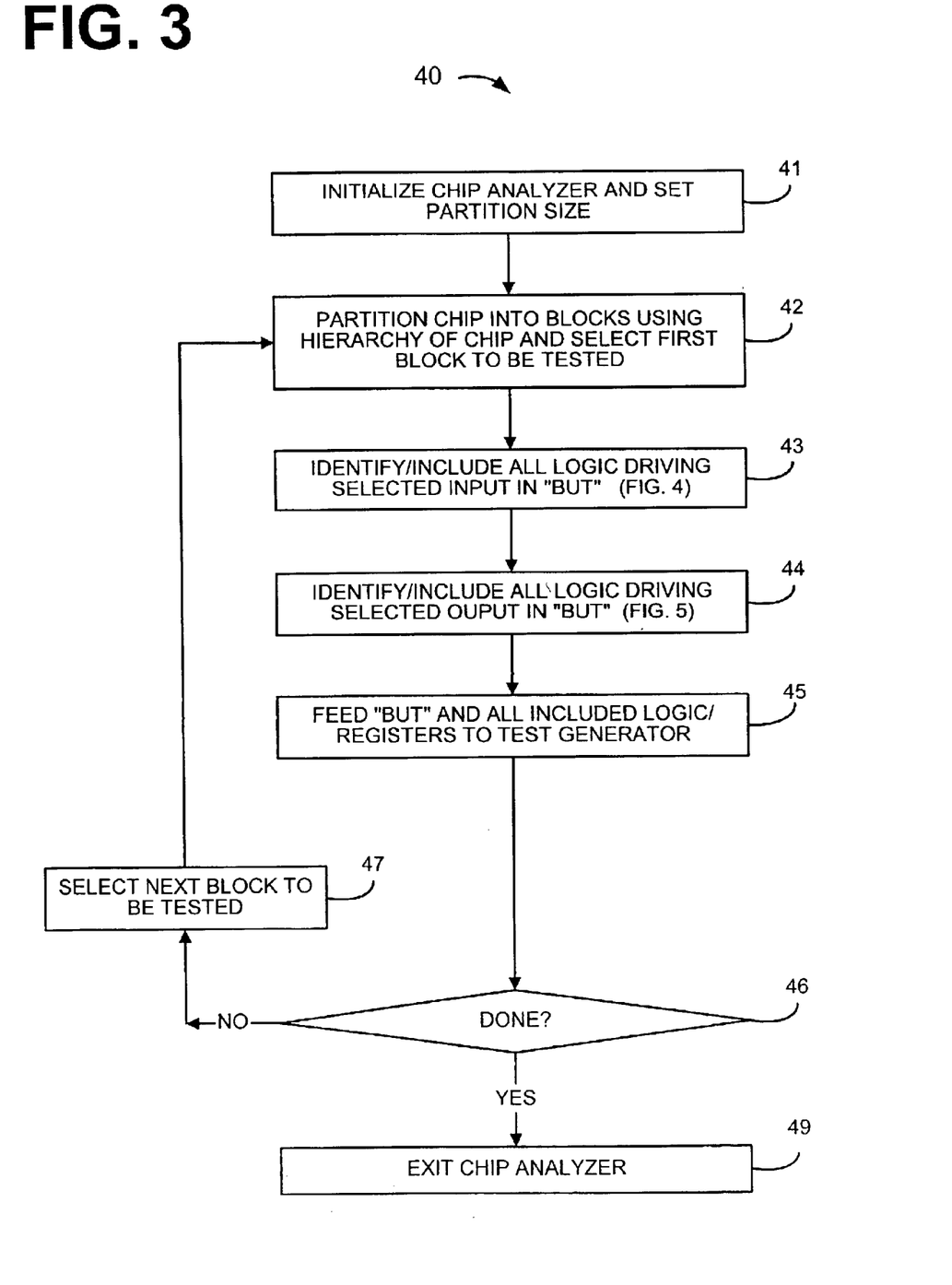
FIG. 3 is a flow chart illustrating one possible implementation of a method of the chip analyzer of the present invention as shown in FIGS. 1 and 2.

Illustrated in FIG. 3, is a flow chart illustrating one possible implementation of the method of the present invention used in conjunction with the chip analyzer 40, as shown in FIGS. 1 and 2. The chip analyzer 40 is used to partition a large complex chip design into smaller and easier to handle portions (i.e. blocks) in which to test. The smaller blocks are analyzed for inputs and outputs signals that could cause any speed related defects, as well as speed paths internal to the portion. Partitioning large complex chip designs enables an automatic test generator 100 (FIG. 1) to generate test programs 110 more efficiently, utilizing less memory and requiring a shorter run time. The chip analyzer 40 also enables a chip designer to focus on particular areas or blocks to test in an integrated circuit design.

As shown in FIG. 3, the chip analyzer 40 is initialized and then sets a partition size threshold, at step 41. The partition size threshold may be set utilizing a default setting or may be set by the chip designer performing the chip testing. It is also possible that the chip designer may identify a specific partition to test at this step. This partition may follow the logical hierarchy of the chip (i.e. the same partitioning that is used in the logical design of the chip may be used). At step 42, the chip analyzer 40 partitions the chip design into blocks using the hierarchy of the chip, and then selects a first block to be tested.

Figure 4:
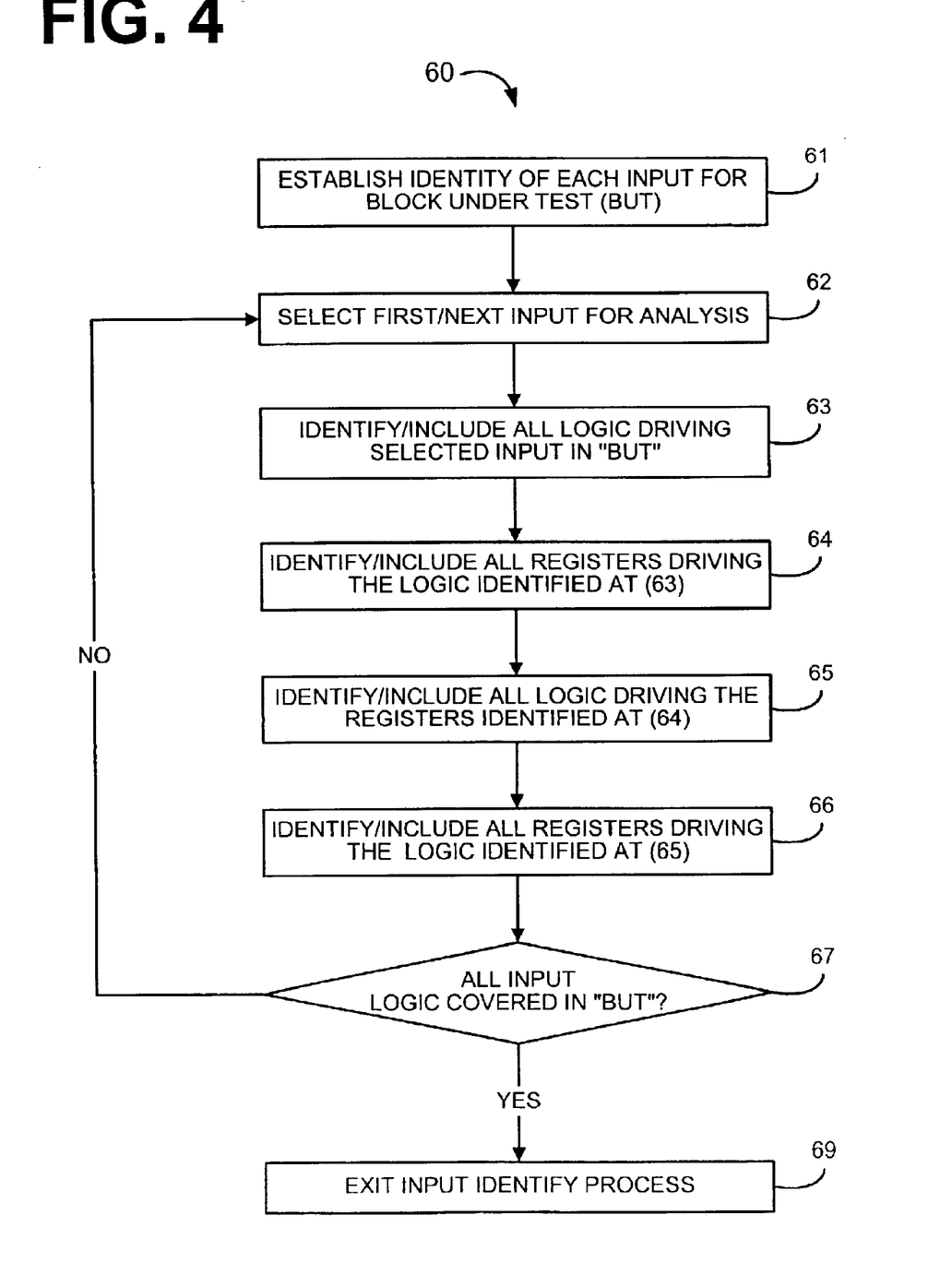
FIG. 4, is a flow chart illustrating one possible implementation of the input identify process, as shown in FIG. 3, that identifies all logic driving inputs of the block under test.

At step 43, the chip analyzer 40 establishes the identity of all logic driving inputs for the selected block under test, and is herein described in further detail with regard to FIG. 4.

The inputs identified by the chip analyzer 40 of the present invention for the block under test include, any logic found that drives inputs of the logic within the block under test, and the registers (i.e. second level registers) that drive that logic to the block under test. In addition, the chip analyzer 40 of the present invention can identify values for any logic that input into these second level registers. These second level registers include any registers immediately preceding the logic in the block under test. Any logic that is input into these second level registers immediately preceding the block under test is included as well. Any logic that precedes the second level registers that immediately precede the logic within the block under test may have inputs from other registers (i.e. first level registers). These first level registers input into the logic that precedes the second level register that are the registers that immediately precede the logic within the block under test.

Figure 5:
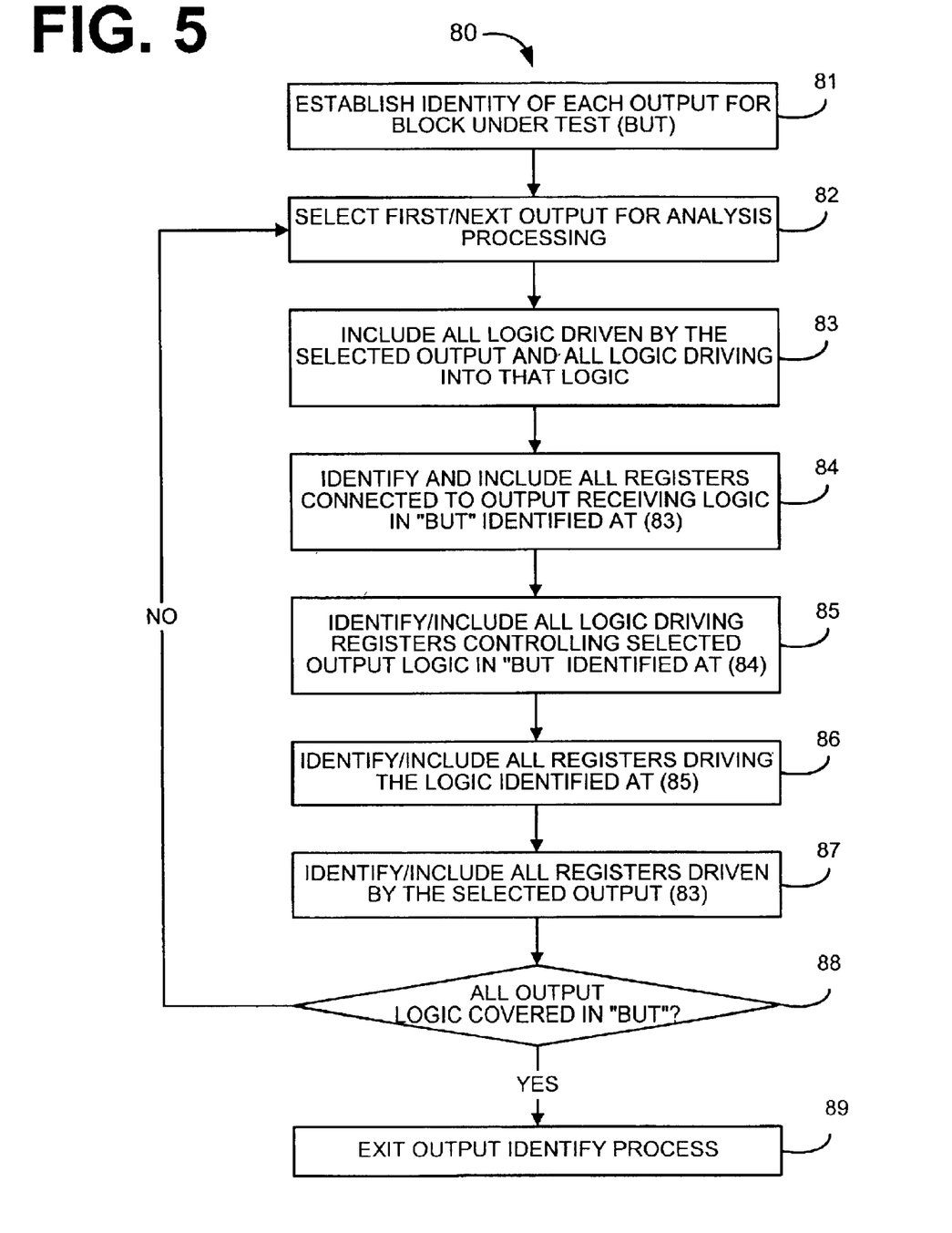
FIG. 5 is a flow chart illustrating one possible implementation of the output identify process, as shown in FIG. 3, that identifies logic driving outputs of the block under test and logic driven by the outputs of the block under test.

Next at step 44, the chip analyzer 40 establishes the identity of all logic driving outputs for the selected block under test, and is herein described in further detail with regard to FIG. 5. These outputs include the logic driven by the outputs from the block under test and any registers that follow the logic in the block under test (i.e. result registers). Other inputs to that logic should also be included back two levels of registers as well (i.e. much the same as the input of the block as performed at step 43).

At step 45, the chip analyzer 40 provides the information about the block under test, including all logic and registers, into a test generator system 100 (FIG. 1). At step 46, the chip analyzer 40 determines if there are more blocks to be analyzed for test generation. If it is determined in step 46 that there are more blocks to be analyzed for test generation, then the chip analyzer 40 proceeds to step 47 to select the next block to be tested, and returns to repeat steps 43–46. However, if it is determined in step 46 that there are no more blocks to be tested then the chip analyzer 40 exits at step 49.

In an alternative embodiment, all the input information with regard to the output logic is collected first. Then, the inputs into the logic of the block under test are collected and combined with the inputs that affect the output logic. This output/input analysis is just as efficient to process the logic and may prevent processing duplicate logic in case of feedback type circuitry.

Illustrated in FIG. 4, is a flow chart of one possible implementation of the input identify process 60 that identifies all logic driving inputs of the block under test and should be included in the model constructed by the chip analyzer 40 (FIG. 3). The inputs identified by the input identify process 60 for the block under test includes any logic found that drives the inputs of the logic within the block under test and the registers (i.e. second level registers) that drive that logic to the block under test. In addition, the input identify process 60 can identify values for any logic that inputs into these second level registers. These second level registers include any registers immediately preceding the logic in the block under test, and any logic that is input into those registers immediately preceding the block under test. The logic that precedes the registers that immediately precede the logic within the block under test, may have inputs from other registers (i.e. first level registers). These first level registers input into the logic that precedes the second level register that are the registers that immediately precede the logic within the block under test.

As shown in FIG. 4, the input identify process 60 establishes the identity of each input for the block under test (BUT) at step 61. Next at step 62, the input identify process 60 selects the first/next input for analysis processing. At step 63, the input identify process 60 identifies and includes any logic, with their respective initial values, driving the selected input in the block under test.

At step 64, the input identify process 60 identifies all the registers, and their respective initial values, connected to the selected logic, and includes any the registers driving the selected input and the logic identified at step 63. The logic, and their respective initial values, driving the inputs to the registers identified at step 64, are to be included with their respective initial values at step 65. The registers that control the logic identified at step 65 are to be included with their respective initial values, at step 66. It is in the processing blocks 63–66, that the input identify process 60 identifies any of the logic and registers, as well as initial values of the logic and registers that can effect and control the inputs into the blocks under test.

The input identify process 60 next determines if all the input logic has been processed in the block under test at step 67. If it is determined at step 67 that all the inputs for the block under test have not been processed, the input identify process 60 returns to repeat steps 62–67. If it is determined at step 67 that all the inputs for the block under test have been processed, the input identify process 60 then exits at step 69 and returns control to the chip analyzer 40.

FIG. 5 is a flow chart illustrating one possible implementation of the output identify process 80, as shown in FIG. 3. The output identify process 80 identifies logic driving outputs of the block under test and logic driven by the outputs of the block under test, used in conjunction with the chip analyzer 40 of the present invention, as shown in FIGS. 1–3. These outputs includes the logic driving the outputs from the block under test, and any logic driven by the outputs from the block under test (i.e. result registers that follow the logic in the block under test). Other inputs to that logic should also be included back two levels of registers as well (i.e. much the same as the input of the block).

As shown in FIG. 5, the output identify process 80 establishes the identity of each output link for the block under test (BUT) at step 81. Next at step 82, the output identify process 80 selects the first or next output for analysis processing. At step 83, the output identify process 80 then includes any logic receiving the selected output, as well as the logic driving into the other inputs of that logic.

At step 84, the output identify process 80 identifies all the registers driving to the selected output logic identified at step 83. At step 85, the output identify process 80 includes any additional logic driving into the registers identified at step 84. The output identify process 80 also includes at step 86, the registers driving that input logic identified at step 85. At step 87, the output identify process 80 includes any additional registers driven by the output from the block under test (i.e. result registers). The output identify process 80 in steps 82–87 is attempting to identify all the registers and logic, with their respective initial values, that receive or control data being output from the block under test.

At step 88, the output identify process 80 then determines if all the output logic is processed for the block under test. If it is determined in step 88 that there are more outputs to be processed, then the output identify process 80 returns to repeat steps 82–88. However, if it is determined in step 88 that all the outputs for the block under test have been processed, then the output identify process 80 exits at step 89 and returns to the chip analyzer 40.

Figure 6:
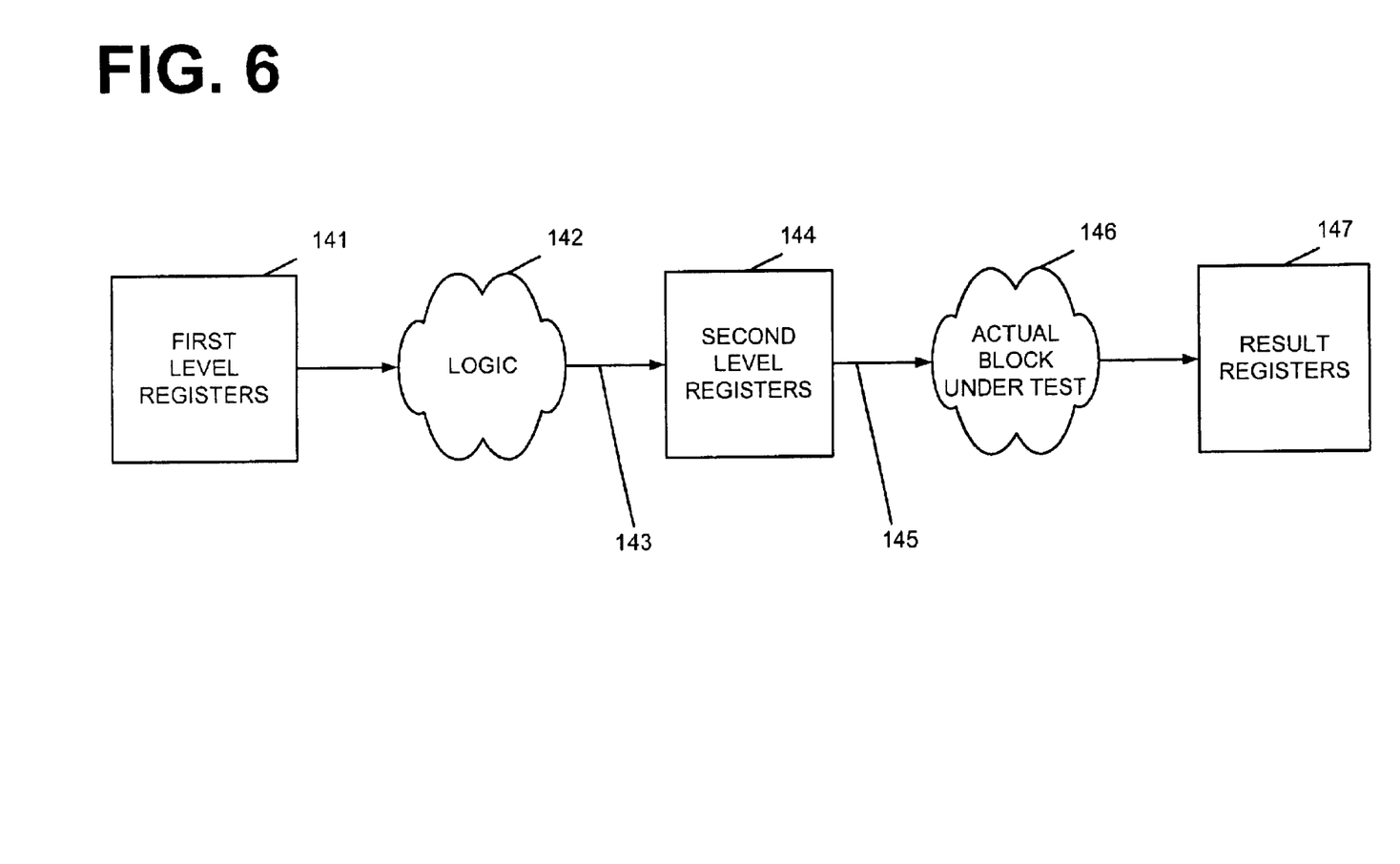
FIG. 6 is a diagram illustrating one possible example of the operation of the chip analyzer for scan-based delay test generation, as shown in FIGS. 1, 2 and 3.

Illustrated in FIG. 6 is a block diagram illustrating how the scan-based delay test generation is performed. In order to do a delay test on the actual logic under test 146, the initial values are needed to sensitize the path being tested and provide a starting state for the path. This is done by scanning the input values to the logic under test 146 into the second level registers 144. The transition values are values that will occur on the output of the second level registers 144 when a clock toggles. The transition values continue to sensitize a path being tested and provide a transition state for that path.

In order to set these transition values, a trace back through the logic 142 that is input into the second level registers 144 and back to the first level registers 141 which provide input into logic 142 is performed. The logic scan of the values in the first level registers 141 and logic 142 produce the transition values for the second level registers 144. The results of the logic under test 146 are captured in the result registers 147. Generally, the results are captured on the clock cycle following the one that causes the transitions. However, it is understood that different clocking schemes can be used.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for testing an integrated circuit, comprising the steps of:

partitioning a model of the integrated circuit into a plurality of circuit configurations;

selecting one of the plurality of circuit configurations;

identifying logic outside the selected circuit configuration driving input logic in the selected circuit configuration;

identifying output logic outside the selected circuit configuration being driven by the selected circuit configuration;

identifying logic outside the selected circuit configuration that is driving the output logic; and providing information describing the selected circuit configuration, the logic driving the input logic, the output logic, and the logic driving the output logic to a test program configured to use the information to generate test patterns to be used for speed-testing the selected circuit configuration.

2. A method for testing an integrated circuit, comprising the steps of:

partitioning a model of the integrated circuit into a plurality of circuit configurations;

selecting one of the plurality of circuit configurations;

identifying logic outside the selected circuit configuration driving input logic in the selected circuit configuration;

identifying output logic outside the selected circuit configuration being driven by the selected circuit configuration;

identifying logic outside the selected circuit configuration that is driving the output logic; and identifying second level registers driving the input logic in the selected circuit configuration.

3. The method of claim 2, wherein the step of identifying logic driving input logic in the selected circuit configuration further comprises:

identifying logic outside the selected circuit configuration driving the second level registers.

4. The method of claim 3, wherein the step of identifying logic driving input logic in the selected circuit configuration further comprises:

identifying first level registers driving the logic outside the selected circuit configuration.

5. A system for testing an integrated circuit, comprising:

means for partitioning a model of the integrated circuit into a plurality of circuit configurations;

means for selecting one of the plurality of circuit configurations;

means for identifying logic outside the selected circuit configuration driving input logic in the selected circuit configuration;

means for identifying output logic outside the selected circuit configuration being driven by the selected circuit configuration;

means for identifying logic outside the selected circuit configuration that is driving the output logic; and means for providing information describing the selected circuit configuration, the logic driving the input logic, the output logic, and the logic driving the output logic to a test program configured to use the information to generate test patterns to be used for speed-testing the selected circuit configuration.

6. A system for testing an integrated circuit, comprising:

means for partitioning a model of the integrated circuit into a plurality of circuit configurations;

means for selecting one of the plurality of circuit configurations;

means for identifying logic outside the selected circuit configuration driving input logic in the selected circuit configuration;

means for identifying output logic outside the selected circuit configuration being driven by the selected circuit configuration;

means for identifying logic outside the selected circuit configuration that is driving the output logic; and means for identifying second level registers driving the input logic in the selected circuit configuration.

7. The system of claim 6, further comprising:

means for identifying logic outside the selected circuit configuration driving the second level registers.

8. The system of claim 7, further comprising:

means for identifying first level registers driving the logic outside the selected circuit configuration.

9. A computer readable storage medium containing program code for testing an integrated circuit, comprising:

a first code segment configured to partition a model of the integrated circuit into a plurality of circuit configurations;

a second code segment configured to select one of the plurality of circuit configurations;

a third code segment configured to identify logic driving input logic in the selected circuit configuration; and a fourth code segment configured to identify output logic outside the selected circuit configuration being driven by the selected circuit configuration; and a fifth code segment configured to identify logic outside the selected circuit configuration that is driving the output logic; and a sixth code segment configured to provide information describing the selected circuit configuration, the logic driving the input logic, the output logic, and the logic driving the output logic to a test program configured to use the information to generate test patterns to be used for speed-testing the selected circuit configuration.

10. A computer readable storage medium containing program code for testing an integrated circuit, comprising:

a first code segment configured to partition a model of the integrated circuit into a plurality of circuit configurations;

a second code segment configured to select one of the plurality of circuit configurations;

a third code segment configured to identify logic driving input logic in the selected circuit configuration; and a fourth code segment configured to identify output logic outside the selected circuit configuration being driven by the selected circuit configuration; and a fifth code segment configured to identify logic outside the selected circuit configuration that is driving the output logic; and wherein said third code segment is further configured to identify second level registers driving the input logic the selected circuit configuration.

11. The computer readable storage medium of claim 10, wherein said third code segment is further configured to identify logic outside the selected circuit configuration driving the second level registers.

* * * * *